(12) United States Patent
Goodwin-Johansson (10) Patent No.: US 6,617,643 B1
(45) Date of Patent: Sep. 9, 2003

(54) LOW POWER TUNNELING METAL-OXIDE-SEMICONDUCTOR (MOS) DEVICE

(75) Inventor: Scott H. Goodwin-Johansson, Pittsboro, NC (US)

(73) Assignee: MCNC, Research Triangle Park, NC (US)

( * ) Notice: Subject to any disclaimer, the term of this patent is extended or adjusted under 35 U.S.C. 154(b) by 0 days.

(21) Appl. No.: 10/185,338

(22) Filed: Jun. 28, 2002

(51) Int. Cl.⁷ .................. H01L 29/76; H01L 29/94; H01L 31/062; H01L 31/113; H01L 31/119
(52) U.S. Cl. ........................ 257/335; 257/401
(58) Field of Search ............ 257/69, 204, 282, 257/287, 288, 335, 336, 339, 341, 344, 350, 401, 403, 408, 409

(56) References Cited

U.S. PATENT DOCUMENTS

| | | |
|---|---|---|
| 2,933,619 A | 4/1960 | Heywang |
| 2,983,854 A | 5/1961 | Pearson |
| 3,105,177 A | 9/1963 | Aigrain et al. |
| 3,114,864 A | 12/1963 | Sah |
| 3,171,042 A | 2/1965 | Matare |
| 3,197,652 A | 7/1965 | DeWolf et al. |
| 3,225,272 A | 12/1965 | Cronemeyer |
| 3,309,586 A | 3/1967 | Kleinknecht |
| 3,317,801 A | 5/1967 | Shepherd, Jr. |
| 3,459,967 A | 8/1969 | Tummers et al. |
| 3,943,554 A | 3/1976 | Russell et al. |
| 4,173,763 A | 11/1979 | Chang et al. |
| 4,635,089 A | 1/1987 | Shimbo |
| 4,835,581 A | 5/1989 | Kuroda et al. |
| 4,952,991 A * | 8/1990 | Kayama ............ 257/335 |
| 4,967,224 A * | 10/1990 | Hamada et al. ............ 396/95 |
| 5,032,880 A * | 7/1991 | Tsunoda ............ 257/141 |
| 5,032,891 A | 7/1991 | Takagi et al. |
| 5,105,247 A | 4/1992 | Cavanaugh |
| 5,258,625 A | 11/1993 | Kamohara et al. |
| 5,365,083 A | 11/1994 | Tada |
| 5,386,136 A | 1/1995 | Williams et al. |
| 5,422,496 A | 6/1995 | Kamohara et al. |
| 5,686,739 A | 11/1997 | Baba |
| 5,705,827 A | 1/1998 | Baba et al. |
| 6,264,167 B1 * | 7/2001 | Hamazawa ............ 251/288 |
| 6,424,005 B1 * | 7/2002 | Tsai et al. ............ 257/335 |

* cited by examiner

Primary Examiner—Wael Fahmy
Assistant Examiner—Hoai Pham
(74) Attorney, Agent, or Firm—Alston & Bird LLP (57) ABSTRACT

A three terminal tunneling device that has a smaller voltage transition between off-current and on-current states and which also has less dependence on the lateral dimensions of the device. The device is a hybrid between a MOS transistor, a gated diode and a tunneling diode. The semiconductor device includes a lightly doped substrate of a first conductivity type. The lightly doped substrate will include a first heavily doped region of a first conductivity type formed in the substrate and a lightly doped layer of a first conductivity type disposed on the substrate and the first heavily doped region. The device also including a gate insulator layer disposed on the lightly doped layer and underlying a portion of the first heavily doped region and a gate electrode that is disposed on the gate insulator layer. Additionally, the device will include a second heavily doped region of a first conductivity formed in the substrate extending into the first heavily doped region of a first conductivity and a heavily doped region of a second conductivity formed in the substrate extending into the lightly doped substrate and spatially isolated from the first heavily doped region.

32 Claims, 9 Drawing Sheets

LOW POWER TUNNELING METAL-OXIDE-SEMICONDUCTOR (MOS) DEVICE

FIELD OF THE INVENTION

The present invention relates to Metal-Oxide Semiconductor (MOS) devices, and more particularly to a low power, three-terminal tunneling MOS device having operational characteristics that are a hybrid between a MOS transistor, a gated diode and a tunneling diode.

BACKGROUND OF THE INVENTION

Figure 1:
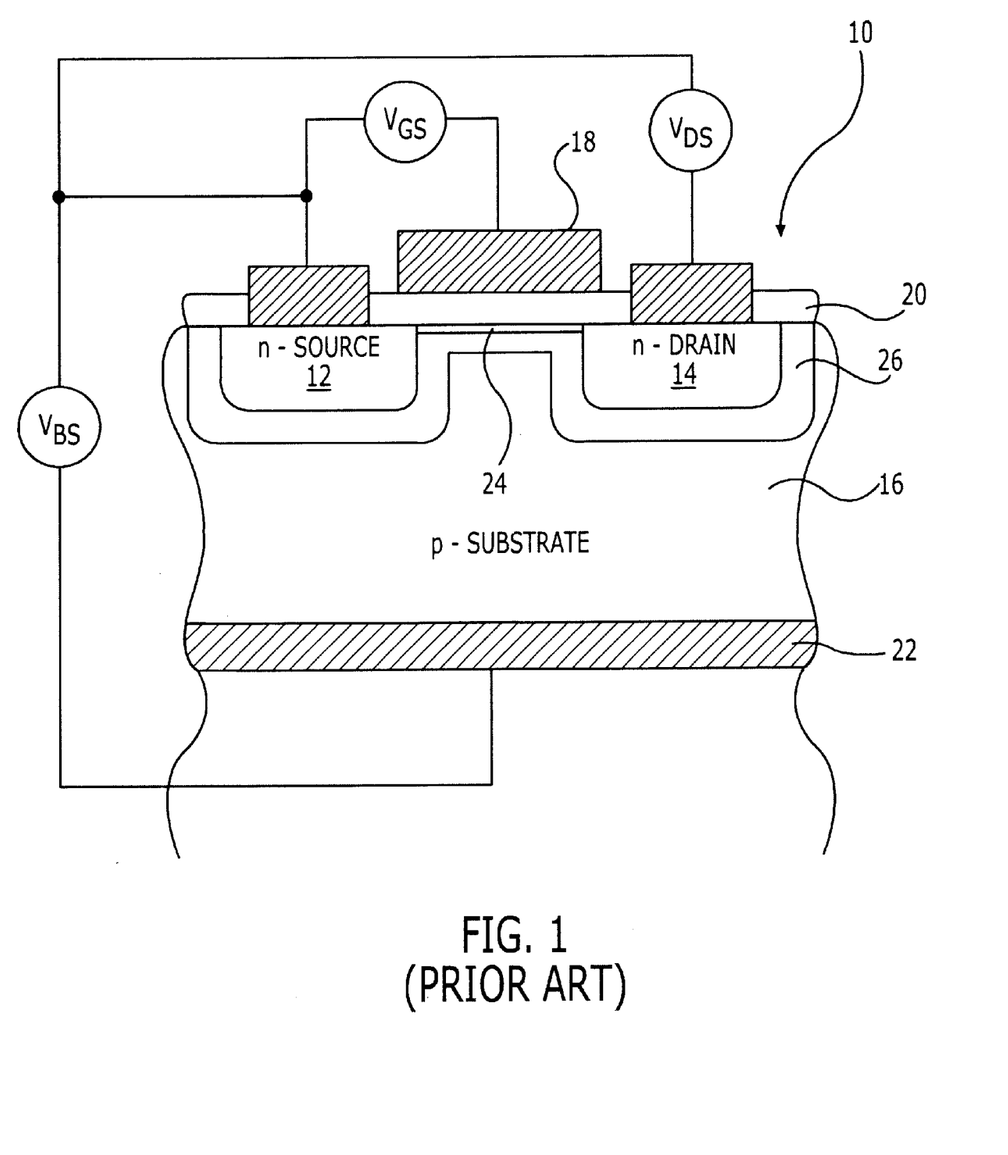
FIG. 1 is a cross-sectional view of a conventional metal oxide semiconductor field effect transistor (MOSFET) device, in accordance with the prior art.

A conventional n-type Metal-Oxide-Semiconductor Field-Effect-Transistor (MOSFET) is shown in the cross-sectional diagram of FIG. 1. The MOSFET 10 consists of a source 12 and a drain 14, two highly conducting n-type semiconductor regions that are isolated from the p-type semiconductor substrate 16 by reversed-biased p-n diodes. A gate electrode 18 generally covers the region between source and drain and is separated from the semiconductor by the gate oxide 20.

The applied voltage will determine which n-type region provides the electrons and becomes the source 12, while the other n-type region collects the electrons and becomes the drain 14. The voltages applied to the drain and gate, as well as, to the substrate 16 by way of the back contact 22 are referred to as the source potential.

The voltage applied to the gate electrode 18 controls the flow of electrons from the source 12 to the drain 14. A positive voltage applied to the gate electrode attracts electrons to the interface between the gate oxide 20 and the semiconductor substrate 16. These electrons form a conducting channel between the source and the drain, referred to as the inversion layer 24. As shown the inversion layer 24 is formed adjacent to the gate oxide 20 above the depletion layer 26. Gate current is not required to maintain the inversion layer at the interface since the gate oxide blocks any carrier flow. The net result is that the voltage that is applied to the gate controls the current between drain and source.

Figure 2:
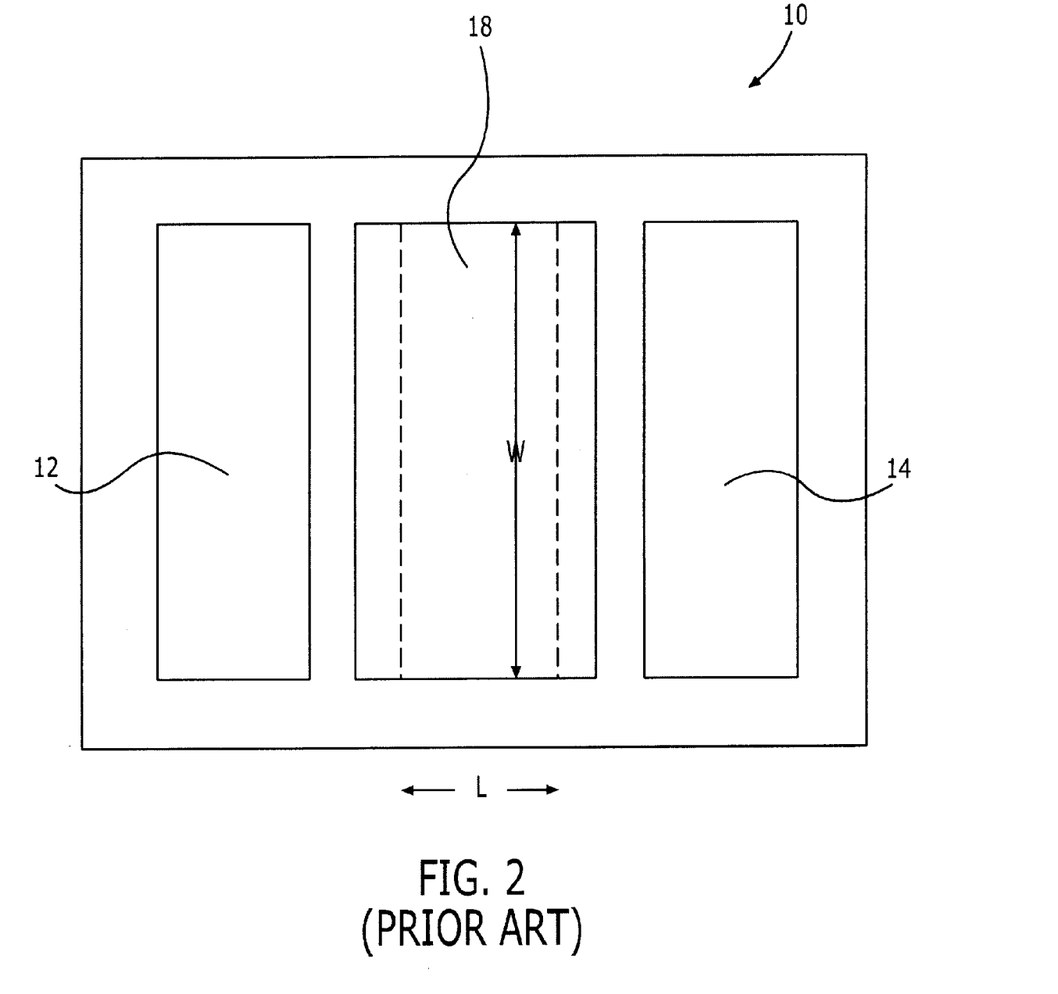
FIG. 2 is a plan view of a conventional MOSFET device, in accordance with the prior art.

FIG. 2 is a plan view diagram of the MOSFET of FIG. 1. The plan view diagram illustrates the gate electrode length L, and the gate electrode width W. Note that the gate electrode length is not defined as the actual physical length of the gate electrode 18, but rather the gate length is defined as the distance between the source region 12 and the drain region 14. The overlap between the gate electrode and the source and drain region is required to ensure that the inversion layer 24 forms a continuous conducting path between the source and drain regions. Typically, this overlap is kept to a minimum in order to minimize parasitic capacitance in the device. In conventional MOSFET devices variances in the length of the gate electrode will affect the turn-on voltage of the device. In this regard, larger gate length devices will require more turn-on voltage and smaller gate length devices will require less turn-on voltage.

Low power electronics based on the style of Complementary Metal Oxide Semiconductors (CMOS) is principally driven by a reduction in the power supply voltage. This is due to the power consumed by a CMOS circuit being primarily due to the charging/discharging of capacitances in the circuit. This power can be defined as $P=\frac{1}{2}CV^2f$, where C is the capacitance of the circuit, V is the power supply voltage, and f is the frequency of the circuit. This relationship makes it apparent that the power is dependent on the square of the voltage.

The second factor that is driving down the CMOS power supply is the scaling of the individual transistors, and the resulting reliability and performance constraints on the power supply voltage. The drive current that can be conducted by a MOS transistor is directly related to the power supply voltage, thus simply reducing the voltage, reduces the drive current, which results in a decrease in the speed and hence the performance of the circuit. Scaled devices are designed to maintain the current drive as much as possible.

One of the variables available to the device designer is the threshold voltage (the transition voltage required to turn the device from an off state to an on state) which determines the drive current. Reducing the threshold voltage increases the drive current of the transistor, however, if the threshold voltage is reduced too far, the off-current of the transistor increases. The off-current needs to remain low to minimize the power consumed due to leakage currents and also to enable the circuit to utilize dynamic logic. The off-current will increase for two principle reasons: the sub-threshold slope and the short channel effect. There is a maximum theoretical rate at which a transistor current will decrease as the gate voltage is decreased. This rate is referred to as the sub-threshold slope and it sets a minimum value for the threshold voltage. In addition, as the transistor is scaled down in size, the threshold voltage tends to decrease and the sub-threshold slope worsens. This further increases the minimum value of the designed threshold voltage. Additionally, variations in the processing leads to variations in the gate length of the transistor and hence variations in the threshold voltage. Thus, the transistor must be designed to have a high enough threshold voltage to maintain a minimum off-current for the shortest transistor.

Much of the effort to date in low power electronics has been focused on silicon-on-insulator (SOI) MOS transistors. These devices have steeper sub-threshold slopes due to the thin silicon channels and reduced parasitic capacitances due to the buried insulator film.

In electrical devices fabricated with semiconductor materials an electron tunneling effect can be realized by forming a junction between a highly doped P-type semiconductor material and a highly doped N-type semiconductor material. The junction provides for a negative resistance characteristic, whereby, as the forward voltage across the junction is increased the current through the junction decreases. The negative resistance characteristic has been beneficially implemented in amplifiers, mixers, oscillators, detectors and the like.

The tunneling of electrons at the PN junction occurs most effectively when a high electric field exists in the semiconductor. For example, tunneling can most readily occur within a reverse-biased depletion region of a silicon PN junction. A narrow depletion region can be achieved when the doping level of the P-type and N-type materials is high, typically on the order of about 1E18 atoms per cubic centimeter ($cm^3$) or higher. The narrow depletion region allows for electrons to tunnel from the P side to the N side where otherwise they would not be prone. The phenomenon in which the valence band electrons penetrate through the energy gap into empty conduction band states is termed "tunneling".

Most tunneling devices, to date, have been two-terminal diode type devices. While the two-terminal devices are advantageous in many applications, such devices are typically required to be integrated with other devices to achieve an overall circuit function. In addition, the two-terminal device does not typically lend itself to controlling the tunneling effect without implementation of external circuits. Thus, a need exists to develop a semiconductor device having tunneling capabilities and more than two terminals to allow for control of the device characteristics. In addition, such a device will benefit from having a smaller gate voltage transition between the off-current and on-current states and which also has less dependence on the lateral dimensions of the device. Additionally, a need exists to develop a semiconductor device that exhibits other beneficial electrical characteristics beyond negative resistance characteristics to thereby enhance the applicability of such devices.

SUMMARY OF THE INVENTION

The present invention provides for a three terminal tunneling device that has a smaller voltage transition between off-current and on-current states and which also has less dependence on the lateral dimensions of the device. The device is a hybrid between a MOS transistor, a gated diode and a tunneling diode.

The semiconductor device of the present invention will include a lightly doped substrate of a first conductivity type. The substrate will typically be formed of a conventional silicon-on-oxide (SOI) substrate although it is also possible to form the device in composite with other similar devices using junctions and/or reverse bias junctions. The lightly doped substrate will include a first heavily doped region of a first conductivity type formed in the substrate and a lightly doped layer of a first conductivity type disposed on the substrate and the first heavily doped region. The lightly doped layer of a first conductivity type will have a predefined thickness, generally a thin layer, to provide for electron tunneling between the conduction band and valence band during device operation.

The semiconductor device of the present invention will also include a gate insulator layer disposed on the lightly doped layer and underlying a portion of the first heavily doped region. A gate electrode is disposed on the gate insulator layer. As such, the device of the present invention vertically aligns the gate electrode, the lightly doped layer of a first conductivity type and the heavily doped region of the first conductivity type. By implementing a lightly doped region, between the gate and the heavily doped region, precise control over the threshold voltage can be realized. In preferred embodiments of the invention the gate insulator layer will comprise a high dielectric constant material, typically in the range of about 25. The high dielectric constant material will increase the capacitive coupling between the gate electrode and the interface surface of the substrate.

The semiconductor device of the present invention will additionally include a second heavily doped region of a first conductivity formed in the substrate extending into the first heavily doped region of a first conductivity. The second heavily doped region of a first conductivity will form either the drain or the source depending upon the conductivity. As such, first heavily doped region of a first conductivity is an extension of either the drain or the source. The device also includes a heavily doped region of a second conductivity formed in the substrate extending into the lightly doped substrate and spatially isolated from the first heavily doped region. The heavily doped region of a second conductivity will form either the source or the drain depending upon the conductivity.

In one specific embodiment of the present invention the semiconductor device includes a SOI substrate having lightly doped P-type silicon disposed on an insulator. A heavily doped P-type region is formed in the silicon. This region serves as a source extension region. A lightly doped P-type layer is disposed on the silicon and the heavily doped P-type region. The lightly doped P-type layer will have a predefined thickness, generally minimal thickness, to provide for electron tunneling between the conduction band and valence band during device operation.

A gate insulator layer is disposed on the lightly doped P-type layer and underlies a portion of the heavily doped P-type region. A gate electrode is disposed on the gate insulator layer. Hence, in vertical alignment a lightly doped P-type region is disposed between the gate and the heavily doped P-type region to allow for precise control over the threshold voltage during device turn-on. The gate insulator layer will comprise a high dielectric constant material, typically in the range of about 25. The high dielectric constant material will increase the capacitive coupling between the gate electrode and the interface surface of the substrate.

The second and third terminals of the device include a P-type source region formed in the silicon adjacent to a first vertical side of the gate insulator layer and gate electrode. The P-type source region extends into the heavily doped P-type region such that the heavily doped P-type region becomes an extension of the source. A N-type drain region is formed in the substrate adjacent to a second vertical side of the gate insulator layer and gate electrode that is opposite the first vertical side, the N-type drain region extending into the lightly doped P-type silicon layer and spatially isolated from the heavily doped region.

Additionally, the present invention is defined by a method for fabricating the semiconductor device of the present invention. An SOI substrate is provided that has a lightly doped silicon layer of a first conductivity type. A first heavily doped region of a first conductivity type is defined within the silicon layer, typically via ion implantation processing. A lightly doped layer of a first conductivity type is disposed on the silicon layer and the first heavily doped region of a first conductivity type. The lightly doped layer of a first conductivity type is typically disposed by low temperature epitaxial growth processing. A gate insulator layer is disposed on the lightly doped layer of a first conductivity type and a gate electrode is then disposed on the gate insulator layer. The gate insulator and gate electrode being defined in an area that underlies a portion of the first heavily doped region of a first conductivity type.

Defining the second and third terminals completes the device fabrication. A second heavily doped region of a first conductivity type is defined in the silicon adjacent to a first vertical side of the gate insulator and gate electrode. The second heavily doped region of a first conductivity type will extend into the first heavily doped region of a first conductivity type. A heavily doped region of a second conductivity type is defined in the silicon adjacent to a second vertical side of the gate insulator and gate electrode, opposite the first vertical side. The heavily doped region of a second conductivity type is spatially isolated from the first and second heavily doped regions of a first conductivity type. The second heavily doped region of a first conductivity type and the heavily doped region of a second conductivity type are typically formed by ion implantation processing.

The present invention provides for a three terminal hybrid semiconductor device. By providing for high doping under the gate electrode the valence and conduction bands are bent sharply during device turn-on with a very thin depletion layer. This band bending brings the conduction band edge at the surface below the valence band edge slightly further into the substrate. When the bands are bent to this degree, and the spatial separation between these points is minimal, electrons can tunnel between the conduction band and valence band. The effect is a sharp increase in tunneling current due to the onset of the energy level overlap of the band edges of the conduction and valence bands and the large density of states within the bands.

Additionally, by providing for a lightly doped region between the gate electrode and the heavily doped region precise control over the threshold voltage can be realized. The vertical stack formation (i.e., gate, lightly doped layer and heavily doped region) of the device of the present invention is not affected by gate length because the tunneling current is determined by the vertical electric field. As a further inventive attribute, the high dielectric constant gate insulator increases the capacitive coupling between the gate electrode and the insulator-to-substrate interface to provide for sharp turn-on voltage.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3:
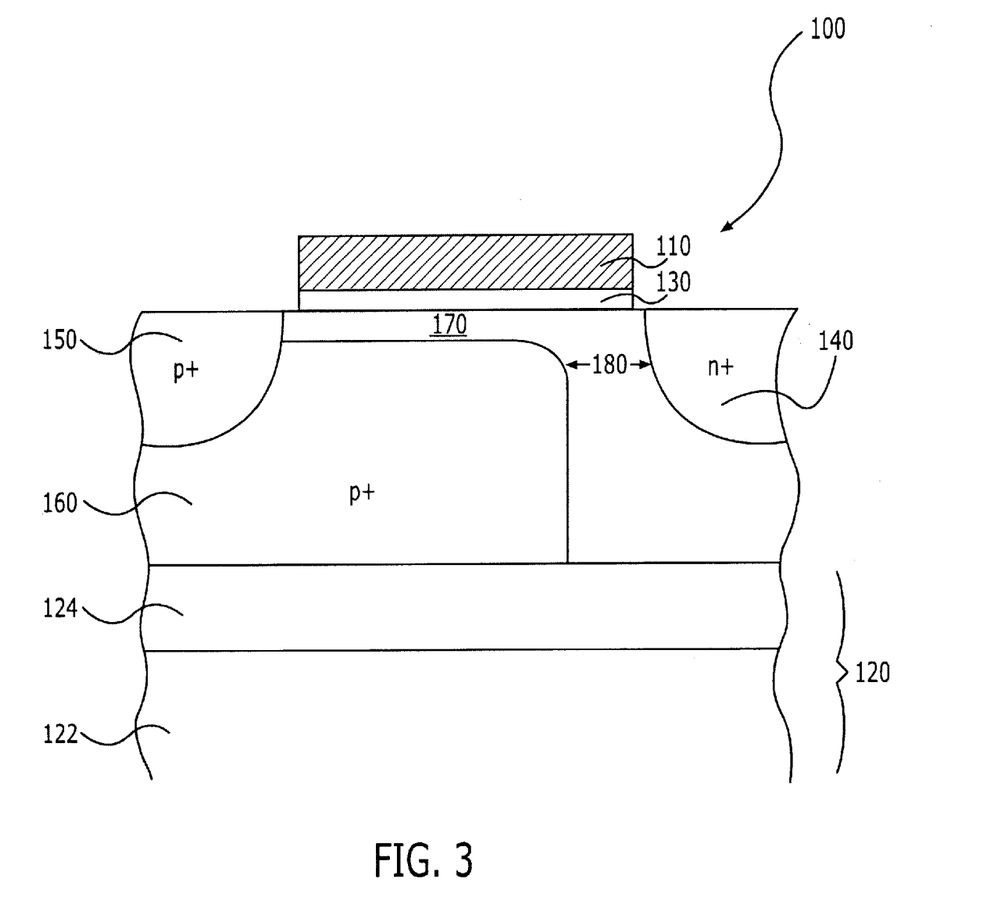
FIG. 3 is a cross-sectional view of a three terminal tunneling MOS device, in accordance with an alternate embodiment of the present invention.

Referring to FIG. 3, illustrated is a cross-sectional diagram of the low power, tunneling MOS device, in accordance with an embodiment of the present invention. The device comprises a three terminal transistor with operational characteristics that are a cross between a MOS transistor, a gated diode and a tunneling diode. The device 100 comprises a gate electrode 110 that is isolated from the substrate construct by a gate oxide/insulator 130. In the depicted device the substrate comprises a SOI (Silicon-On-Insulator) substrate having an insulator layer 124 disposed on a silicon carrier 122. The SOI substrate serves to provide dielectric isolation and reduced capacitance. It is also feasible and within the inventive concepts herein disclosed to implement other suitable substrates for the semiconductor device of the present invention. An n-type region that is formed laterally proximate one side of the gate electrode defines a drain 140. A p-type region that is formed laterally proximate the opposite side of the gate to which the drain is located defines a source 150. A heavily doped p-type region defines the source extension 160, disposed generally under the area of the gate electrode. It should be noted that while the depicted embodiment shows the drain as being an n-type region and the source and source extension as being p-type regions it is also possible to construct the semiconductor device of the present invention with impurity types reversed to create a complementary device. The effect of the device shown in FIG. 3 is a sharp increase in tunneling current due to the onset of the energy level overlap of the band edges of the conduction and valence bands and the large density of states within the bands.

The gap region 170 is defined as lightly doped and is disposed between the gate insulator 130 and the source extension 160. By controlling the vertical distance of the gap region it is possible to assure a sharp turn-on voltage. The distance 180 between the drain region 140 and the source extension 160 is controlled so as insure isolation between the electrodes.

In accordance with the present invention, the device operates in the following manner. In the off state, the gate bias is low and the surface generally under the gate electrode 110 and gate insulator 130 is either accumulated or lightly depleted. The lightly doped gap region 170 between the source extension 160 and the drain region 140 acts as a reverse biased diode to an applied drain-to-source voltage and, as such, the reverse biased diode does not leak current.

Figure 4:
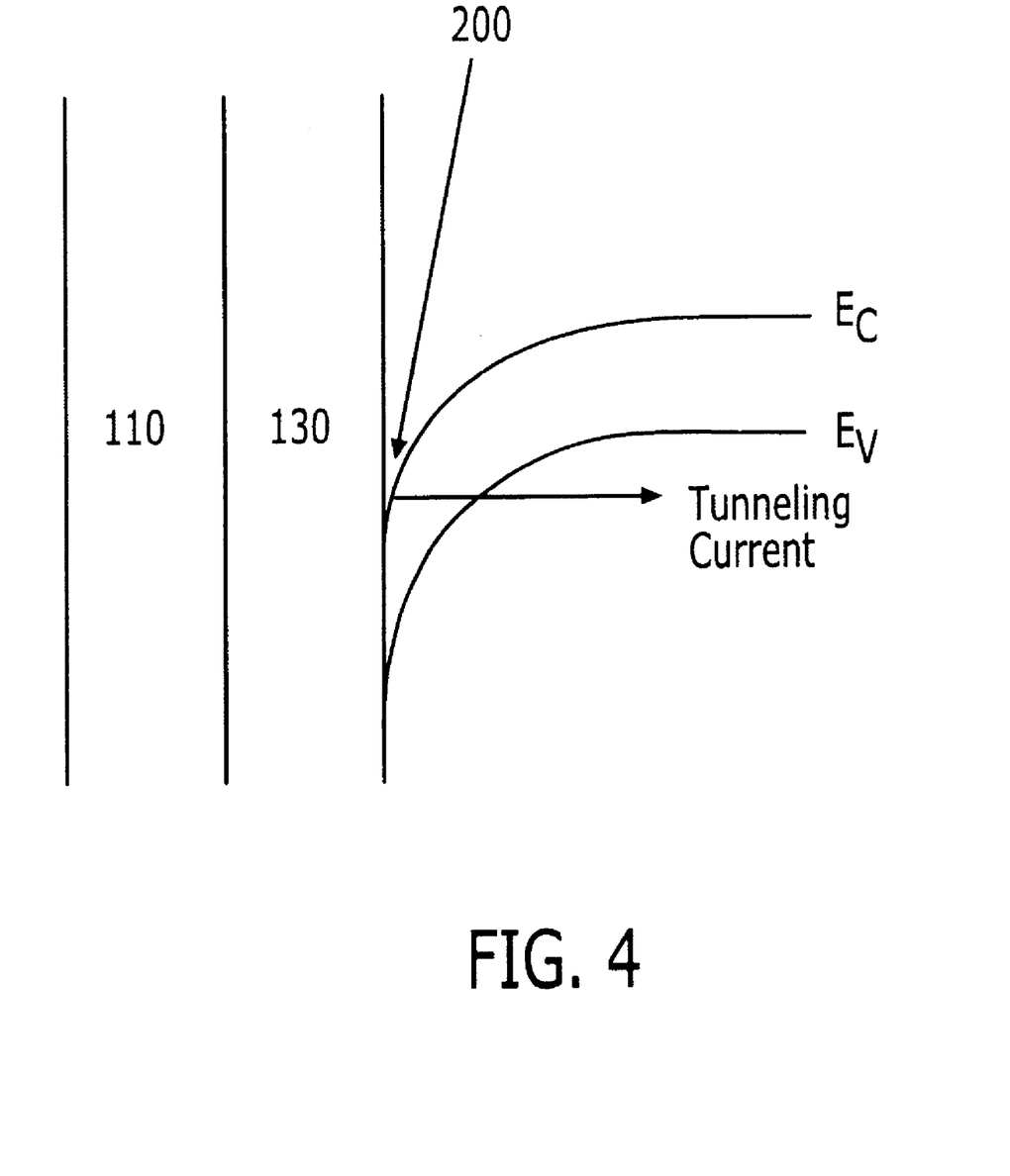
FIG. 4 is a cross-sectional view of the energy bands in the tunneling MOS device, in accordance with an embodiment of the present invention.

FIG. 4 is a cross-sectional diagram of the energy bands located generally in the region beneath the gate electrode 110 and associated gate insulator/oxide 130. In order to turn the device on; the gate bias is increased, causing electrons to tunnel between the conduction band (Ec) and the valence band (Ev). This phenomena occurs because as the gate bias is increased the conduction and valence energy bands (Ec and Ev) at the gap region-to-insulator interface bend to form an inversion layer 200. The existence of the heavily doped source extension 160, generally underlying the gate electrode 110, causes the energy bands to bend sharply with a very thin depletion layer. The band bending brings the conduction band edge at the surface below the valence band edge to a position slightly further into the substrate. When the energy bands are bent at least this much, and the spatial separation between these two points is small enough, electrons can tunnel between the conduction band and the valence band resulting in a sharp turn-on of the current. This phenomena is observed in conventional Zener diodes.

Unlike conventional MOS transistors, the device of the present invention is not affected by gate length because the tunneling current is determined by the vertical electric field. Thus, variations in the length of the gate should not affect the turn-on voltage. In a similar manner, the drain voltage will typically not affect the electric field under the gate, due to the high doping levels in the source extension region. For example, the source extension region is typically doped in the range from about 1E18 atoms/cm$^3$ to about 1E20 atoms/cm$^3$. Since the variations in the turn-on voltage due to lateral geometries is greatly reduced, and since the turn-on is very sharp, the turn-on voltage can be reduced and, hence, the overall power supply voltage can be reduced. Reduction in the power supply voltage reduces the power consumption of the circuit.

Figure 5:
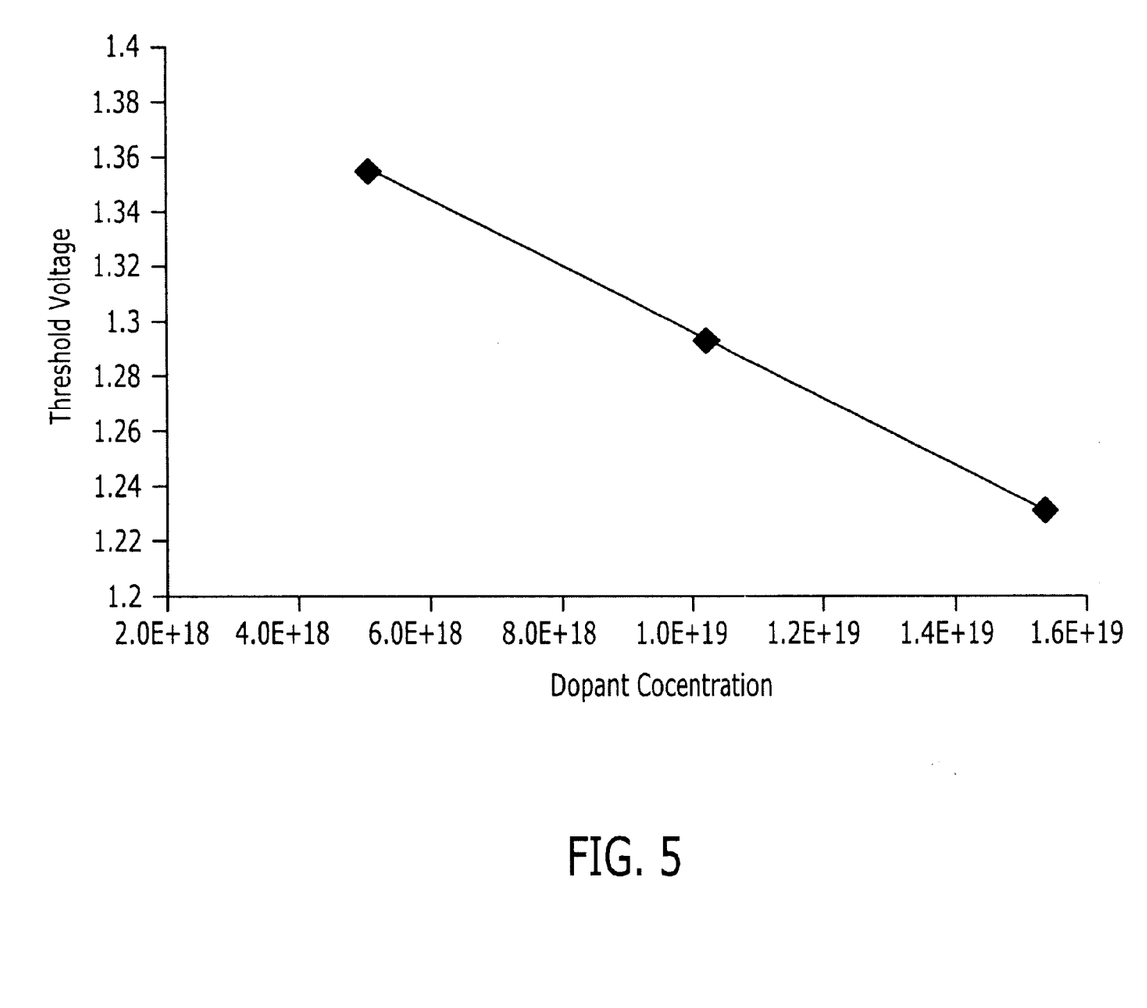
FIG. 5 is a graph diagram of the simulated threshold voltage (i.e., turn-on voltage) as a function of the doping concentration at the semiconductor to gate insulator/oxide interface, in accordance with an embodiment of the present invention.

FIG. 5 is a graphical plot of the simulated threshold voltage (i.e., turn-on voltage) as a function of the doping concentration at the semiconductor to gate insulator/oxide interface. By increasing the doping concentration of the substrate, a higher electric field results at the gate insulation/oxide 130 to substrate 120 interface surface and a higher tunneling current results. Similar to the control of the threshold voltage in a conventional MOS transistor, the turn-on voltage of the present device can be controlled by managing the doping levels at the insulator/semiconductor interface.

The high doping of the substrate results in narrow depletion width in the substrate that weakens the coupling between the gate voltage and the surface potential. In order to strengthen the coupling, the MOS tunneling device of the present invention will typically comprise a high dielectric constant insulator/oxide layer 130. For example, tantalum oxide or a similar oxide having a dielectric constant in the range of about 20 to about 50 is preferred. The use of such a high dielectric constant oxide will sharpen the turn-on characteristics of the device.

Bandgap engineering, such as the silicon germanium system, can also be implemented to optimize the tunneling structure of the present invention. Bandgap engineering provides for the alteration of the energy gap by changing the chemical composition. The smaller bandgap of certain materials, such as germanium, increases the amount of tunneling current for a predefined electric field.

As is known by those of ordinary skill in the art, the impurity types can be reversed (i.e., the source region becoming the drain region and the drain region becoming the source region) to form a complementary device. In the complementary device the holes flow as opposed to the electrons. Such complementary devices are typically required to enable a CMOS-like circuit.

Figure 6:
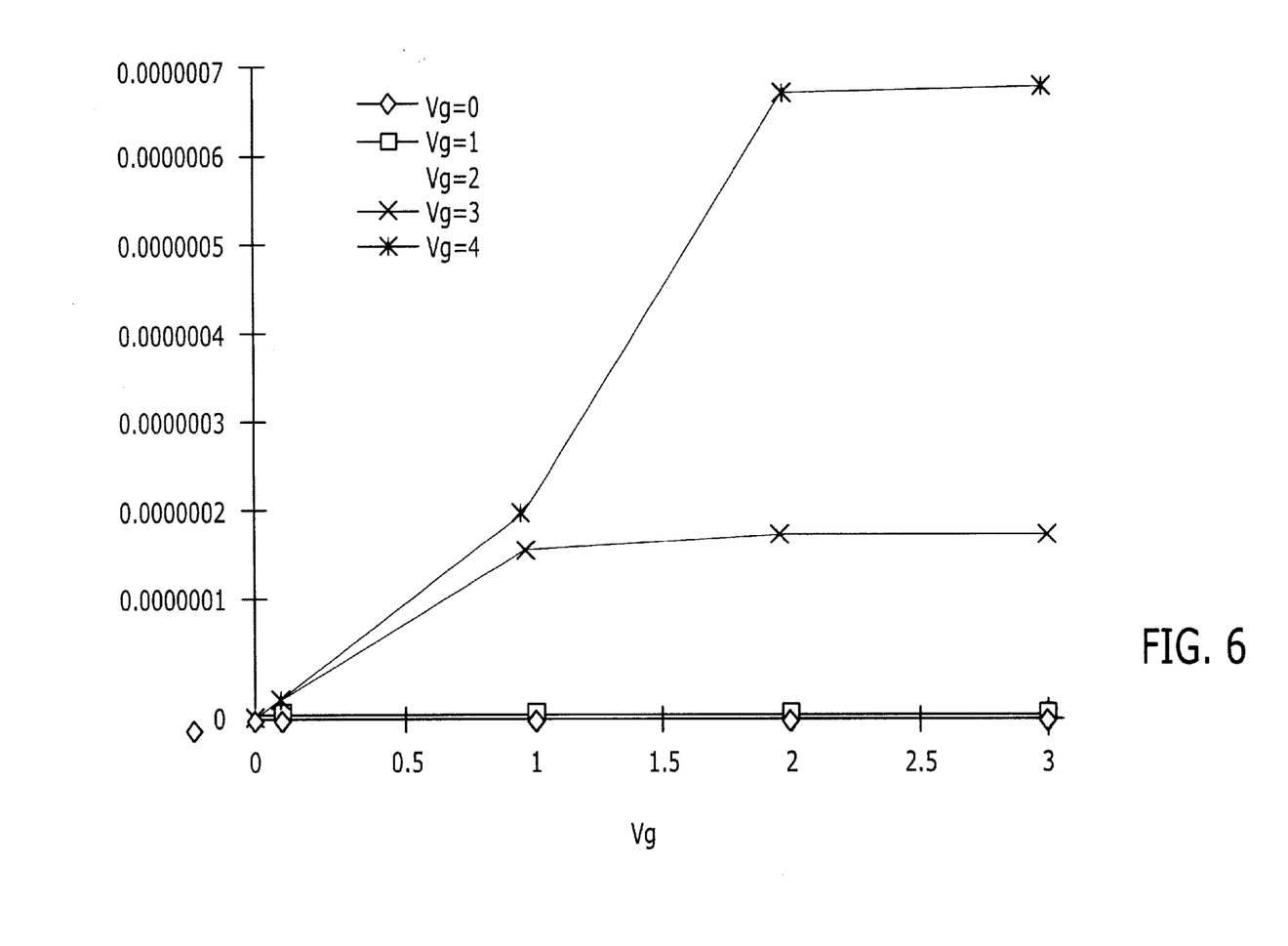
FIG. 6 is a graph diagram of theoretical drain current versus drain voltage as a function of varying gate voltage in a tunneling MOS device, in accordance with an embodiment of the present invention.

FIG. 6 is a graphical representation of theoretical drain current versus drain voltage as a function of varying gate voltage in a tunneling MOS device, in accordance with an embodiment of the present invention. The simulation data that is shown includes a band to band tunneling model based solely on the electric field and does not take into account energy band alignment. As can be seen by the plot, the current increases with gate voltage and is much less dependent on the drain voltage.

Figure 7:
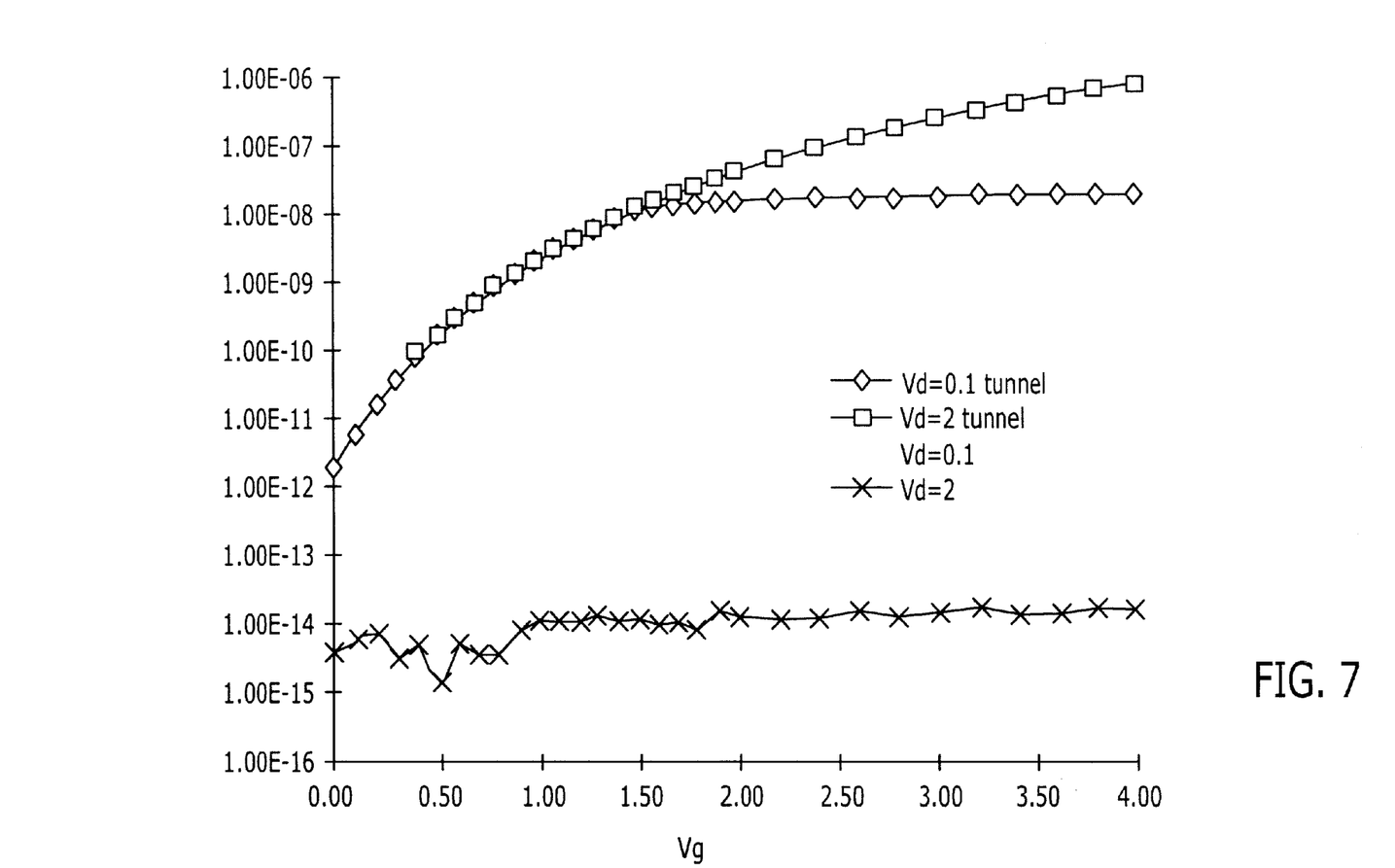
FIG. 7 is a graph diagram of logarithmic drain current versus gate voltage as a function of varying drain biases in a tunneling MOS device, in accordance with an embodiment of the present invention

FIG. 7 illustrates a graphical representation of logarithmic drain current versus gate voltage as a function of varying drain biases in a tunneling MOS device, in accordance with an embodiment of the present invention. The upper curves in the graph (i.e., the curves represented by squares and diamonds) are based on tunneling current models and the lower curves (i.e., the curves represented by triangles and x's) are based on models without tunnel current. Because the tunneling model used in this representation is only based on the electric field, it calculates a tunneling current when the bands are beginning to bend while before the bands actually overlap. Theoretically there should be no current until the bands overlap. The simulation would indicate that for the tunneling MOS device of the present invention the overlap occurs at approximately 1.3 volts and, thus, the current in the device should move from the lower, no tunneling model, curves to the upper, tunneling model curves, at this bias.

Figure 8A:
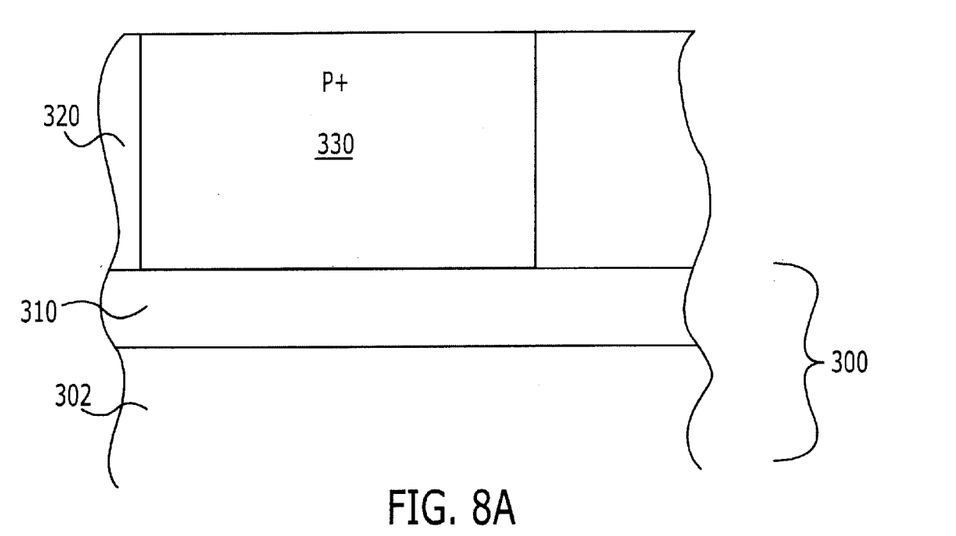
FIGS. 8A–8C are cross-sectional diagrams of various stages in the fabrication of the tunneling MOS device, in accordance with an embodiment of the present invention.
Figure 8B:
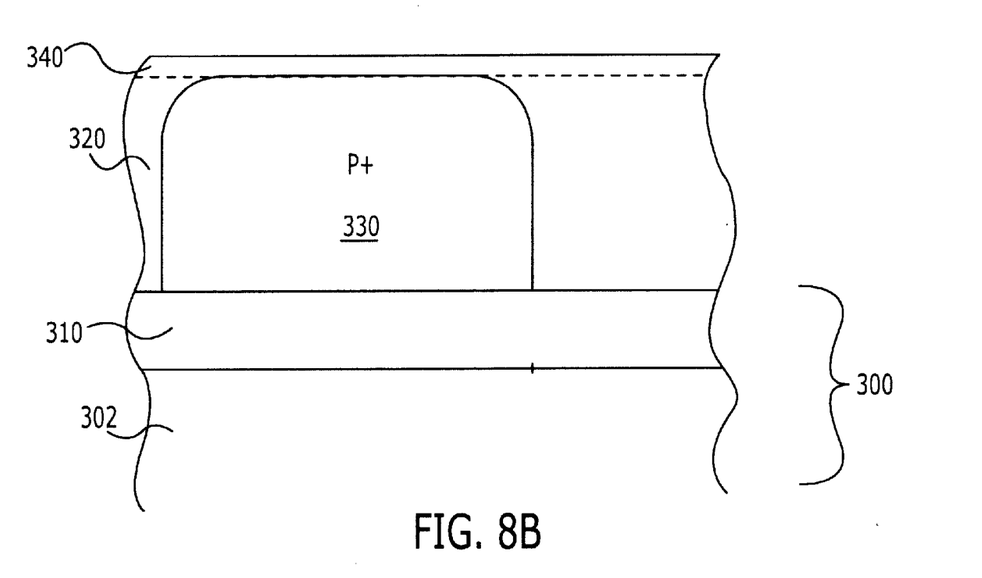
Figure 8C:
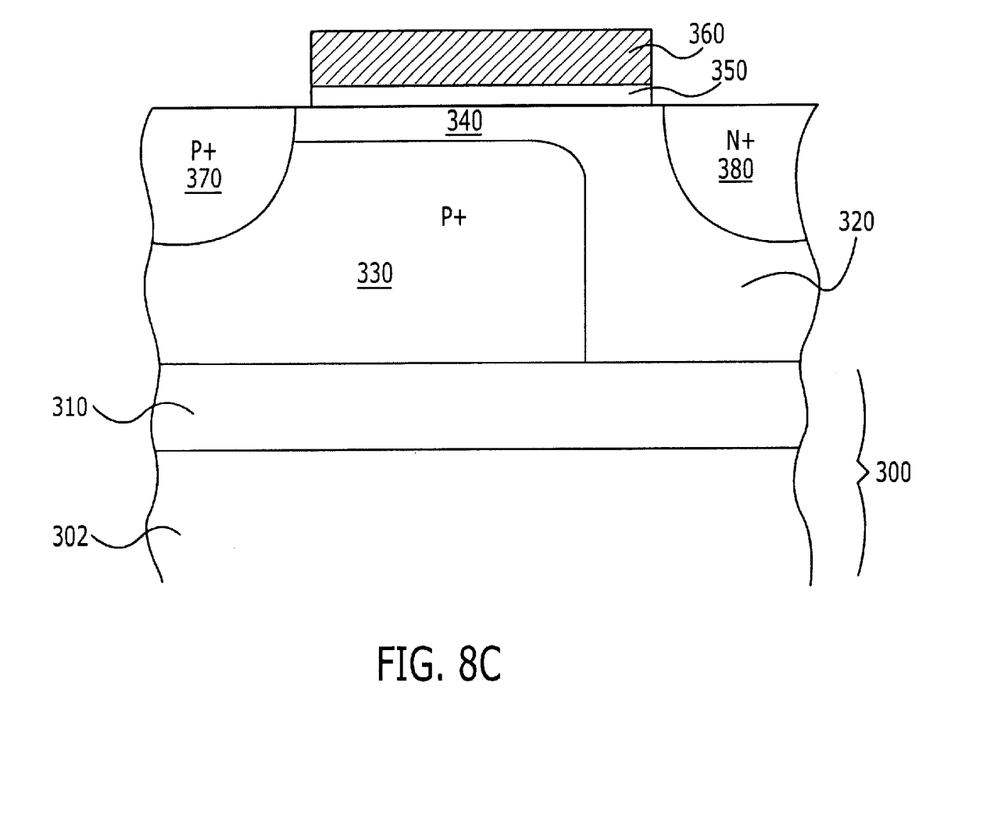

The fabrication of the MOS tunneling device of the present invention is illustrated in the cross-sectional views of FIGS. 8A–8C. As shown in FIG. 8A, in one embodiment of the invention the substrate 300 comprises a SOI (Silicon-On-Insulator) substrate that serves to provide dielectric isolation and reduce parasitic capacitance. It is also possible to fabricate the device by implementing junctions and/or reverse bias junctions that would serve to isolate the device from joining devices. Using conventional deposition techniques, the insulator layer 310 is typically disposed on the silicon carrier 302. The insulator layer will typically have a thickness of about 0.05 micrometers to about 0.1 micrometers and the silicon carrier will typically have a thickness of about 400 micrometers to about 800 micrometers. The disposed on the insulator layer is a silicon layer 320 that is lightly doped P-type with a doping level of the P-type impurities in the range of about 1E14 to about 1E16 atoms/cm$^3$. After an appropriate mask and pattern process, a heavily doped P-type region 330 is formed within the silicon layer. The heavily doped P region will define the source extension region of the tunneling MOS device of the present invention. The heavily doped region will typically have a doping level of the P-type impurities in the range of about 1E19 to about 1E20 atoms/cm$^3$. The heavily doped region can be formed by diffusion or ion implantation techniques, using boron, phosphorus, arsenic or other conventional dopants.

FIG. 8B depicts a cross-sectional view of the fabrication of the tunneling MOS device post epi-growth processing. An silicon epitaxial layer 340 is grown at a low temperature, typically about 700° C. to about 900° C. on the lightly doped P-type silicon layer 320 and the heavily doped P-type region 330. The epitaxial layer will be similar in semiconductor characteristics to the lightly doped P-type silicon layer 320. The epitaxial layer will typically have a thickness of about 100 angstroms to about 500 angstroms and will be doped to a concentration of about 1E17 atoms/cm$^3$ to about 1E19 atoms/cm. Low temperature processing will limit the degree to which dopants diffuse out of the epitaxial layer into the heavily doped region during the growth process.

FIG. 8C depicts a cross-sectional view of the completed fabrication of the tunneling MOS device, in accordance with the present invention. Typically the gate insulator/oxide layer 350 and the gate electrode will be disposed prior to defining the source and drain regions within the substrate. The insulator/oxide layer will typically comprise an oxide material with a high dielectric constant, such as tantalum oxide or the like. A higher dielectric material provides for more charge per area, which is necessary to achieve the high band bending in the heavily doped region of the substrate. A conventional photolithography process is used to dispose the insulator/oxide on the substrate and to define the gate areas. The insulator/oxide layer will typically have a thickness of about 30 angstroms to about 200 angstroms.

The gate electrode 360 will typically comprise polysilicon or a suitable metallic material, such as aluminum, tungsten, copper or the like. The gate electrode is typically disposed using conventional CVD techniques and will have a thickness in the range of about 0.1 micrometers to 5.0 micrometers.

The source 370 and drain 380 regions will typically be defined using conventional ion implantation and activation techniques. The dopants used to form the source and drain regions may include boron, phosphorous, arsenic or similar dopant materials. The depth of the ion diffusion into the substrate will generally not be as critical as is typically the case with conventional MOSFET devices. In conventional devices the depth of the ion diffusion is kept to a minimum so as to not effect the current flow underneath the source and the drain. In this instance, the ion implantation process should be sufficient enough to allow for the source region 370 to extend into the heavily doped P-type region 330. The drain region 380 should extend, in the lengthwise direction, so that it underlaps the gate insulator/oxide layer 360 and gate electrode 260. The underlap of the drain region is necessary to connect the inversion layer to the drain. The source region 370, as depicted in FIG. 8C, does not extend, in the lengthwise direction, and, thus, does not underlap the gate insulator/oxide layer and gate electrode. While it would be feasible to fabricate the device of the present invention with the source region underlapping the gate insulator/oxide layer and gate electrode, in most instances, to insure uniform ban bending and reliable turn on and turn off transitions the source region will not underlap the gate insulator/oxide layer and/or the gate electrode.

In standard MOSFET devices the current flow is proportional to the W/L ratio, where W is the width of the gate and L is the length of separation between the source and drain. Thus, minimizing the length dimensions in standard MOSFET devices provides for devices with maximum current drive. In the device of the present invention the current flow is proportional to the plan view area of the gate electrode (i.e., the width of the gate x the actual length of the gate). Thus, as the area of the gate electrode increases the current flow increases. For large current carrying devices, the source and drain may be fabricated in an interdigitated form in plan view in order to maximize the current drive by controlling the parasitic resistance of the inversion layer.

The present invention provides for a three terminal hybrid semiconductor device that is capable of a sharp turn-on voltage and precise control of the threshold voltage. Threshold voltage control is realized by implementing a lightly doped region between the gate electrode and the heavily doped region precise control over the threshold voltage can be realized. Additionally, the vertical stack formation (i.e., gate, lightly doped layer and heavily doped region) of the device is not generally not affected by gate length because the tunneling current is determined by the vertical electric field. The device of the present invention also benefits from having a high dielectric constant gate insulator that increases the capacitive coupling between the gate electrode and the insulator-to-substrate interface to provide for sharp turn-on voltage.

That which is claimed:

1. A semiconductor device, comprising:
   a lightly doped substrate of a first conductivity type;
   a heavily doped region of a first conductivity type disposed in the substrate;
   a lightly doped region of a first conductivity type disposed on the substrate and the first heavily doped region;
   a heavily doped region of a second conductivity type disposed in the substrate and spatially isolated from the heavily doped region of a second conductivity type;
   a gate insulator layer disposed on the lightly doped layer and a portion of the heavily doped region of a first conductivity type; and
   a gate electrode disposed on the gate insulator.

2. The semiconductor device of claim 1, wherein the substrate comprises a lightly doped silicon layer of a first conductivity type disposed on an insulator layer.

3. The semiconductor device of claim 1, wherein the gate insulator layer further comprises an insulator material having a higher dielectric constant than silicon dioxide.

4. The semiconductor device of claim 1, wherein the lightly doped layer of a first conductivity type has a thickness that is predefined to provide for electron tunneling between a valence band and a conduction band during device operation.

5. The semiconductor device of claim 1, wherein the lightly doped layer of a first conductivity type has a thickness in the range of about 100 angstroms to about 500 angstroms.

6. A semiconductor device, comprising:
   a lightly doped substrate of a first conductivity type;
   a first heavily doped region of a first conductivity type formed in the substrate;
   a lightly doped layer of a first conductivity type disposed on the substrate and the first heavily doped region;
   a gate insulator layer disposed on the lightly doped layer and a portion of the first heavily doped region;
   a gate electrode disposed on the gate insulator;
   a second heavily doped region of a first conductivity formed in the substrate and extending into the first heavily doped region of a first conductivity; and
   a heavily doped region of a second conductivity formed in the substrate extending into the lightly doped substrate and spatially isolated from the first heavily doped region.

7. The semiconductor device of claim 6, wherein the substrate comprises a lightly doped silicon layer of a first conductivity type disposed on an insulator layer.

8. The semiconductor device of claim 7, wherein the lightly doped silicon layer of a first conductivity type comprises a P-type material.

9. The semiconductor device of claim 6, wherein the first heavily doped region of a first conductivity type and the lightly doped layer of a first conductivity type comprise a P-type material.

10. The semiconductor device of claim 9, wherein the second heavily doped region of a first conductivity type comprises a P-type material that defines the source region of the device and the heavily doped region of a second conductivity type comprises an N-type material that defines the drain region of the device.

11. The semiconductor device of claim 6, wherein the first heavily doped region of a first conductivity type and the lightly doped layer of a first conductivity type comprise a N-type material.

12. The semiconductor device of claim 11, wherein the second heavily doped region of a first conductivity type comprises a N-type material that defines the source region of the device and the heavily doped region of a second conductivity type comprises an P-type material that defines the drain region of the device.

13. The semiconductor device of claim 6, wherein the gate insulator layer further comprises an insulator material having a higher dielectric constant than silicon dioxide.

14. The semiconductor device of claim 6, wherein the gate insulator layer further comprises tantalum oxide.

15. The semiconductor device of claim 6, wherein the lightly doped layer of a first conductivity type has a thickness that is predefined to provide for electron tunneling between a valence band and a conduction band during device operation.

16. The semiconductor device of claim 6, wherein the lightly doped layer of a first conductivity type has a thickness in the range of about 100 angstroms to about 500 angstroms.

17. The semiconductor device of claim 6, wherein the spatial isolation between the heavily doped region of a second conductivity and the first heavily doped region of a first conductivity provides in operation a reversed biased diode to an applied drain to source voltage.

18. The semiconductor device of claim 6, wherein a portion of the first heavily doped region of a first conductivity generally underlies the gate electrode to cause sharp valence and conduction band bending upon an increase in gate bias.

19. A semiconductor device comprising:
- a substrate comprising a lightly doped P-type silicon layer disposed on an insulator layer;
- a heavily doped P-type region formed in the silicon layer of the substrate;
- a lightly doped P-type layer disposed on the silicon layer and the heavily doped P-type region;
- a gate insulator layer disposed on the lightly doped P-type layer and a portion of the heavily doped P-type region;
- a gate electrode disposed on the gate insulator;
- a P-type source region formed in the silicon layer of the substrate extending into the heavily doped P-type region; and
- a N-type drain region formed in the substrate extending into the lightly doped P-type silicon layer and spatially isolated from the heavily doped region.

20. The semiconductor device of claim 19, wherein the gate insulator layer further comprises an insulator material having a higher dielectric constant than silicon dioxide.

21. The semiconductor device of claim 19, wherein the gate insulator layer further comprises tantalum oxide.

22. The semiconductor device of claim 19, wherein the lightly doped P-type layer has a thickness that is predefined to provide for electron tunneling between valence band and conduction band during device operation.

23. The semiconductor device of claim 19, wherein the lightly doped P-type layer has a thickness in the range of about 100 angstroms to about 500 angstroms.

24. The semiconductor device of claim 19, wherein the spatial isolation between the N-type drain region and the heavily doped P-type region provides in operation a reversed biased diode to an applied drain to source voltage.

25. The semiconductor device of claim 19, wherein a portion of the heavily doped P-type region of a first conductivity generally underlies the gate electrode to cause sharp valence and conduction band bending upon an increase in gate bias.

26. A semiconductor device comprising:
- a substrate comprising a lightly doped N-type silicon layer disposed on an insulator layer;
- a heavily doped N-type region formed in the silicon layer of the substrate;
- a lightly doped N-type layer disposed on the silicon layer and the heavily doped N-type region;
- a gate insulator layer disposed on the lightly doped N-type layer and a portion of the heavily doped N-type region;
- a gate electrode disposed on the gate insulator;
- a N-type source region formed in the silicon layer of the substrate extending into the heavily doped N-type region; and
- a P-type drain region formed in the substrate extending into the lightly doped N-type silicon layer and spatially isolated from the heavily doped region.

27. The semiconductor device of claim 26, wherein the gate insulator layer further comprises an insulator material having a higher dielectric constant than silicon dioxide.

28. The semiconductor device of claim 26, wherein the gate insulator layer further comprises tantalum oxide.

29. The semiconductor device of claim 26, wherein the lightly doped N-type layer has a thickness that is predefined to provide for electron tunneling between valence band and conduction band during device operation.

30. The semiconductor device of claim 26, wherein the lightly doped N-type layer has a thickness in the range of about 100 angstroms to about 500 angstroms.

31. The semiconductor device of claim 26, wherein the spatial isolation between the P-type drain region and the heavily doped N-type region provides in operation a reversed biased diode to an applied drain to source voltage.

32. The semiconductor device of claim 26, wherein a portion of the heavily doped N-type region of a first conductivity generally underlies the gate electrode to cause sharp valence and conduction band bending upon an increase in gate bias.

* * * * *